United States Patent
Ohta

(10) Patent No.: US 8,324,040 B2
(45) Date of Patent: Dec. 4, 2012

(54) SEMICONDUCTOR DEVICE AND METHOD FOR FABRICATING THE SAME

(75) Inventor: Hiroyuki Ohta, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 237 days.

(21) Appl. No.: 12/785,016

(22) Filed: May 21, 2010

(65) Prior Publication Data

US 2010/0233860 A1    Sep. 16, 2010

Related U.S. Application Data

(62) Division of application No. 11/337,556, filed on Jan. 24, 2006, now abandoned.

(30) Foreign Application Priority Data

Jul. 26, 2005  (JP) ................................. 2005-215479

(51) Int. Cl.
*H01L 21/8238* (2006.01)
*H01L 21/44* (2006.01)

(52) U.S. Cl. .................... 438/199; 438/664; 438/682

(58) Field of Classification Search .................. 438/199, 438/585, 664, 682; 257/E21.622, E21.636, 257/E21.634
See application file for complete search history.

(56) References Cited

U.S. PATENT DOCUMENTS

| | | | |
|---|---|---|---|
| 5,194,749 A | 3/1993 | Meguro et al. | |
| 6,562,718 B1 | 5/2003 | Xiang et al. | |
| 6,645,826 B2 | 11/2003 | Yamazaki et al. | |
| 2002/0093046 A1 | 7/2002 | Moriya et al. | |
| 2003/0181005 A1 | 9/2003 | Hachimine et al. | |
| 2004/0121612 A1 | 6/2004 | Koh et al. | |
| 2004/0232494 A1* | 11/2004 | Nagano et al. | 257/382 |
| 2004/0251479 A1 | 12/2004 | Tsutsui et al. | |
| 2005/0156208 A1 | 7/2005 | Lin et al. | |
| 2006/0267106 A1* | 11/2006 | Chao et al. | 257/382 |

FOREIGN PATENT DOCUMENTS

| | | |
|---|---|---|
| CN | 1445838 A | 10/2003 |
| JP | 08-045877 A | 2/1996 |
| JP | 8-213612 A | 8/1996 |
| JP | 2002-217410 A | 8/2002 |
| JP | 2003-273240 A | 9/2003 |
| JP | 2005-005633 A | 6/2005 |
| KR | 19960000961 B1 | 1/1996 |
| KR | 20030076173 A | 9/2003 |

(Continued)

OTHER PUBLICATIONS

Chinese Office Action dated Feb. 5, 2010, issued in corresponding Chinese Patent Application No. 200610009213.

(Continued)

*Primary Examiner* — Hung Vu
(74) *Attorney, Agent, or Firm* — Westerman, Hattori, Daniels & Adrian, LLP

(57) ABSTRACT

A semiconductor device including an n-channel MISFET including source/drain regions 38 formed in a semiconductor substrate 10 with a channel region between them, and a gate electrode 44 of a metal silicide formed over the channel region with a gate insulating film 12 interposed therebetween; and an insulating film 46 formed over the gate electrode 44 from side walls of the gate electrode 44 to an upper surface of the gate electrode 44, having a tensile stress from 1.0 to 2.0 GPa and applying the tensile stress to the channel region.

16 Claims, 12 Drawing Sheets

FOREIGN PATENT DOCUMENTS

KR          20040037545 A      5/2004

OTHER PUBLICATIONS

Chinese Office Action dated Jul. 25, 2008, issued in corresponding Chinese Patent Application No. 2006100092136.

Korean Office Action dated Dec. 12, 2006, issued in corresponding Korean Patent Application No. 10-2006-0011934.

Japanese Office Actioin dated Jul. 3, 2012, issued in corresponding Japanese Patent Application No. 2006-186460, with English translation (7 pages).

* cited by examiner

SEMICONDUCTOR DEVICE AND METHOD FOR FABRICATING THE SAME

CROSS REFERENCE TO RELATED APPLICATIONS

This application is a divisional of U.S. application Ser. No. 11/337,556, filed Jan. 24, 2006, which is based upon and claims the benefit of priorities from the prior Japanese Patent Application No. 2005-215479, filed on Jul. 26, 2005, the entire contents of which are incorporated herein by reference.

BACKGROUND OF THE INVENTION

The present invention relates to a semiconductor device and a method for fabricating the same, more specifically, a semiconductor device including a gate electrode of metal silicide and a method for fabricating the semiconductor device.

In order to improve the characteristics of MISFET devices, techniques of forming the gate electrode of only metal silicide are proposed. The gate electrode formed of metal silicide alone can decrease the gate resistance in comparison to a gate electrode of the polycide structure and can also suppress the depletion of the gate electrode.

As a technique of forming the gate electrode of only metal silicide, it has been proposed that a dummy electrode of amorphous silicon or polycrystalline silicon is formed at the part where the gate electrode is to be formed, a metal is deposited, and thermal processing for the silicidation reaction is made to substitute the dummy electrode into the metal silicide. This technique retains the consistency with the conventional process of forming the source/drain regions by self-alignment with the gate electrode while keeping off the contamination, etc. of the silicon substrate with the metal material.

Otherwise, it is known that tensile strains exerted to the silicon crystal improve the mobility of the electrons in the crystals, and semiconductor device structures utilizing this feature are proposed. A known example of these structures is a film for applying stress called a stressor film which is formed to cover the gate electrode. As the stressor film, silicon nitride-based insulating films, such as silicon nitride film, silicon oxynitride film, etc., are predominantly used. A stressor film having tensile stress is formed over the gate electrode from the side wall thereof onto the upper surface thereof, whereby the tensile strain is applied to the channel region, and the mobility of the electrons in the channel region is improved. Thus, the MIS transistor can be operated at high speed.

However, the present inventors discovered that when a gate electrode of metal silicide is formed by the above-described technique, it is difficult to induce lattice strain into the channel region by the use of a stressor film.

In the technique of replacing the dummy electrode by metal silicide, an inter-layer insulating film is formed, covering the dummy electrode, the surface of the inter-layer insulating film is planarized to expose an upper surface of the dummy electrode by the CMP (Chemical Mechanical Polishing) method or others, then a metal film is deposited, and thermal processing for silicidizing the metal film is made to thereby substitute the dummy electrode into the metal silicide.

Accordingly, even when the stressor film is formed over the dummy electrode from the side wall onto the upper surface, the stressor film on the upper surface of the dummy electrode is removed in the step of planarizing the inter-layer insulating film, and the tensile stress cannot be applied to the channel region.

SUMMARY OF THE INVENTION

An object of the present invention is to provide a semiconductor device which permits the gate electrode to be formed of metal silicide and a stressor film to be formed over the gate electrode, and a method for fabricating the semiconductor device.

According to one aspect of the present invention, there is provided a semiconductor device comprising: an n-channel MISFET including source/drain regions formed in a semiconductor substrate with a channel region between them, and a gate electrode of a metal silicide formed over the channel region with a gate insulating film interposed therebetween; and a first insulating film formed over the gate electrode from side walls of the gate electrode to an upper surface of the gate electrode, having a tensile stress from 1.0 to 2.0 GPa, and applying a tensile stress to the channel region.

According to another aspect of the present invention, there is provided a method for fabricating a semiconductor device comprising the steps of: forming an n-channel MISFET including source/drain regions formed in a semiconductor substrate with a channel region between them, and a gate electrode of a polycrystalline silicon formed over the channel region with a gate insulating film interposed therebetween; forming a first insulating film over the semiconductor substrate with the n-channel MISFET formed thinner on the gate electrode and thicker on the source/drain regions; etching the first insulating film so that the insulating film is left on the source/drain regions but the gate electrode is exposed; substituting the polycrystalline silicon forming the gate electrode into a metal silicide; and forming a second insulating film over the gate electrode substituted into the metal silicide from side walls of the gate electrode to an upper surface of the gate electrode and having a tensile stress from 1.0 to 2.0 GPa.

According to the present invention, the pattern dependency of the deposited film thickness of an insulating film is utilized to cover the MISFET thin on the gate electrode and thick on the remaining surfaces, whereby the upper part of the gate electrode can be selectively exposed without using a CMP process. The gate electrode of the MISFET can be easily substituted into metal silicide. The stressor film, which is formed after the gate electrode has been substituted into the metal silicide, is formed over the gate electrode from the side wall thereof onto the upper surface thereof, whereby the stressor film can apply a required stress to the channel region. Accordingly, the gate electrode can have lower gate resistance in comparison with the gate electrode of the polycide structure, and the depletion of the gate electrode can be prevented. A required stress can be applied to the channel region by the stressor film, and the mobility of carriers in the channel can be improved. Thus, the MISFET can be operated at high speed.

A polycrystalline silicon film to be the gate electrode is deposited and has the surface planarized, which can decrease the damage of the gate insulating film in the silicidation reaction process for substituting the gate electrode into metal silicide.

DETAILED DESCRIPTION OF THE PREFERRED EMBODIMENTS

The semiconductor device and method for fabricating the same according to a first embodiment of the present invention will be explained with reference to FIGS. 1 to 8B.

Figure 1:
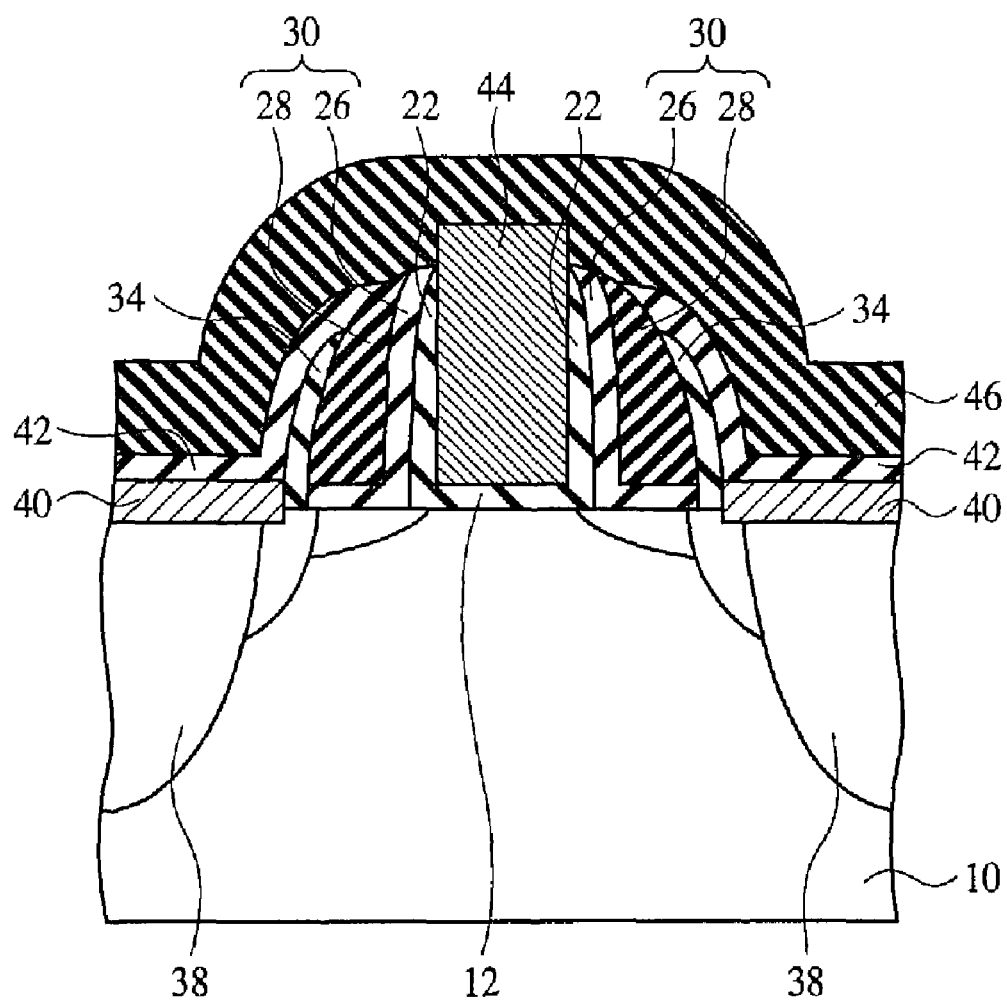
FIG. 1 is a diagrammatic sectional view of the semiconductor device according to a first embodiment of the present invention.

FIG. 1 is a diagrammatic sectional view of the semiconductor device according to the present embodiment, which shows a structure thereof. FIGS. 2A to 7B are sectional views of the semiconductor device according to the present embodiment in the steps of the method for fabricating the same, which show the method. FIGS. 8A and 8B are views explaining the effect of planarizing the surface of a polycrystalline silicon film to be a gate electrode.

First, the structure of the semiconductor device according to the present embodiment will be explained with reference to FIG. 1.

On a silicon substrate 10, a gate electrode 44 of nickel silicide is formed with a gate insulating film 12 interposed therebetween. A sidewall insulating film 22 of a silicon oxide film, a sidewall insulating film 30 formed of a silicon oxide film 26 and a silicon nitride film 28, and a sidewall insulating film 34 of a silicon oxide film are formed on the side walls of the gate electrode 44.

Source/drain regions 38 having the extension structure are formed in the surface of the silicon substrate 10 on both sides of the gate electrode 44. A nickel silicide film 40 is formed on the source/drain regions 38. A silicon oxide film 42 is formed on the nickel silicide film 40.

A stressor film 46 of silicon nitride film is formed over the gate electrode from the side walls thereof onto the upper part thereof with the sidewall insulating films 22, 30, 34 interposed therebetween. The stressor film 46 is a film which applies tensile stress or compression stress to the channel region of the MISFET. To this end, the stressor film 46 must be formed over the entire gate electrode 44 from the side walls thereof onto the upper surface thereof. When the stressor film 46 is formed above the upper surface of the gate electrode 44, sufficient stress cannot be applied to the channel region.

As described above, the semiconductor device according to the present embodiment is characterized mainly in that the gate electrode 44 is formed of metal silicide, and the stressor film 46 is formed over the gate electrode 44 from the side walls thereof onto the upper surface thereof.

The stressor film 46 is for applying stress to the channel region of the MISFET. When the MISFET is n-type, the stressor film has a tensile stress of, e.g., from 1.0 to 3.0 GPa, and when the MISFET is p-type, the stressor film has a compression stress of, e.g. from 1.0 to 2.0 GPa.

The film having a tensile stress means a film which applies the stress to the substrate in the direction of straining the substrate. That is, when the stressor film of a tensile stress is formed over the silicon substrate, the stress is applied in the direction of straining the silicon crystals. Oppositely, the film having a compression stress means a film-which applies a stress to the substrate in the direction of compressing the substrate. That is, when the stressor film having a compression stress is formed over the silicon substrate, the stress is applied in the direction of compressing the substrate. When the stress is applied to the silicon crystal, and a strain is generated, the symmetry of the isotropic band structure of the silicon crystal is broken, and energy level separation takes place. Because of the band structure variation, the carrier scattering due to the lattice vibrations is decreased, and the effective mass is decreased, whereby the mobility of the carriers can be improved.

Thus, the semiconductor device is thus constituted, whereby the gate resistance can be decreased in comparison with the semiconductor device including the gate electrode of the polycide structure, and the depletion of the gate electrode can be prevented. The stressor film 46 can apply a required stress to the channel region, whereby the mobility of the carrier in the channel region can be improved. Thus, the MISFET can be operated at high speed.

Next, the method for fabricating the semiconductor device according to the present embodiment will be explained with reference to FIGS. 2A to 8B.

First, a 1.5 nm-thick silicon oxide film, for example, is formed on a silicon substrate 10 by, e.g., thermal oxidation method. Thus, the gate insulating film of the silicon oxide film is formed. The gate insulating film 12 can be other insulating films, e.g., a silicon oxynitride film.

Figure 2A:
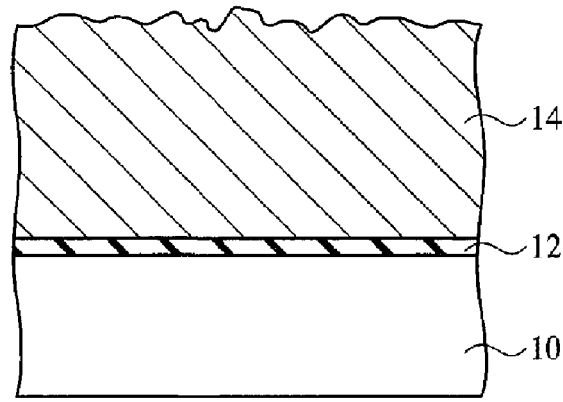
FIGS. 2A-2C, 3A-3C, 4A-4C, 5A-5B, 6A-6B, and 7A-7B showing sectional views of the semiconductor device according to the first embodiment according to the present invention in the steps of the method for fabricating the same.

Then, a 100 nm-thick polycrystalline silicon film 14, for example, is deposited on the gate insulating film by, e.g., CVD method. Cavities and convexities reflecting configurations of the grown grains are present in the surface of the polycrystalline silicon film 14 formed by CVD method (FIG. 2A). In place of polycrystalline silicon film, amorphous silicon film may be deposited.

Figure 2B:
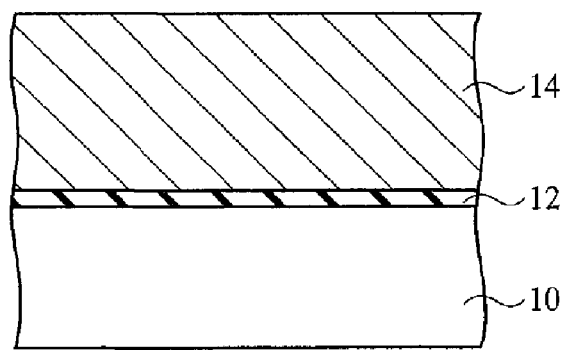
Figure 2C:
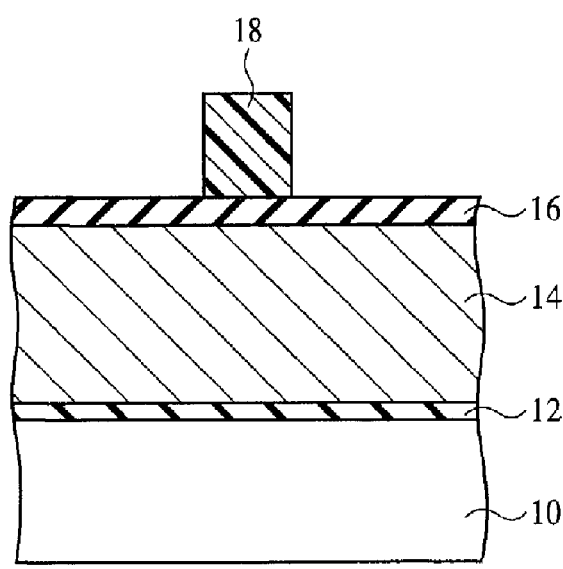

Next, the surface of the polycrystalline silicon film 14 is polished flat by, e.g., CMP method (FIG. 2B).

Next, on the planarized polycrystalline silicon film 14, a 30 nm-thick silicon oxide film 16 is deposited by, e.g., CVD method.

Next, on the silicon oxide film 16, a photoresist film 18 having a pattern of the gate electrode to be formed is formed by photolithography.

Figure 3A:
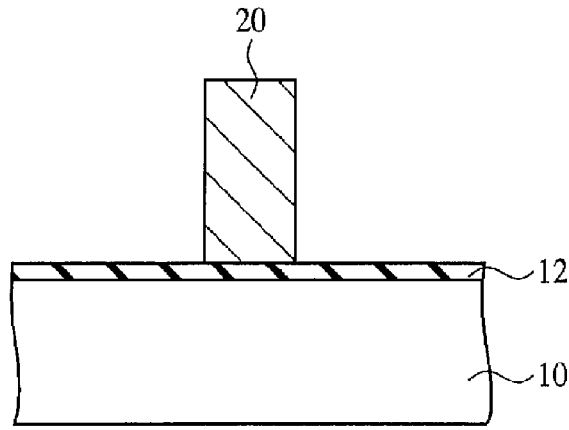

Next, with the photoresist film 18 as the mask, the silicon oxide film 16 and the polycrystalline silicon film 14 are anisotropically etched to form the gate electrode 20 as a dummy electrode of the polycrystalline silicon film 14 (FIG. 3A). At this time, the silicon oxide film 16 is to be the hard mask for patterning the polycrystalline silicon film 14.

Then, the photoresist film 18 is removed by, e.g., ashing, and the silicon oxide film 16 is removed by, e.g., wet etching.

Figure 3B:
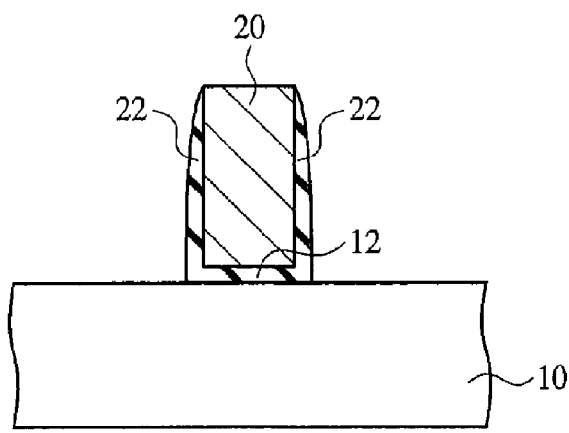

Next, a silicon oxide film of, e.g., 10 nm-thick is deposited by CVD method and etched back to form the sidewall insulating films 22 of the silicon oxide film on the side surfaces of the gate electrode 20 (FIG. 3B).

Figure 3C:
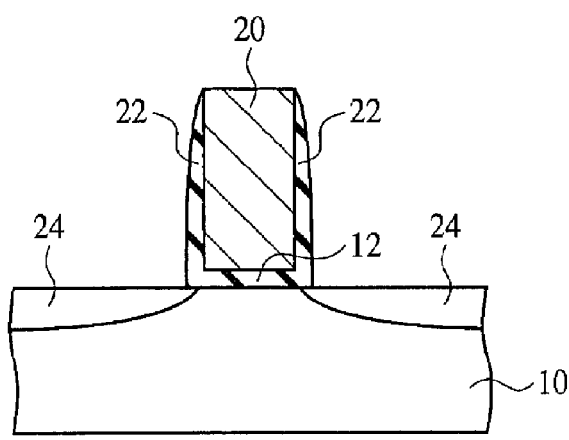

Then, with the gate electrode 20 and the sidewall insulating film 22 as the mask, impurity ions are implanted to form in the silicon substrate 10 on both sides of the gate electrode 20 impurity regions 24 to be the extension regions (FIG. 3C).

Figure 4A:
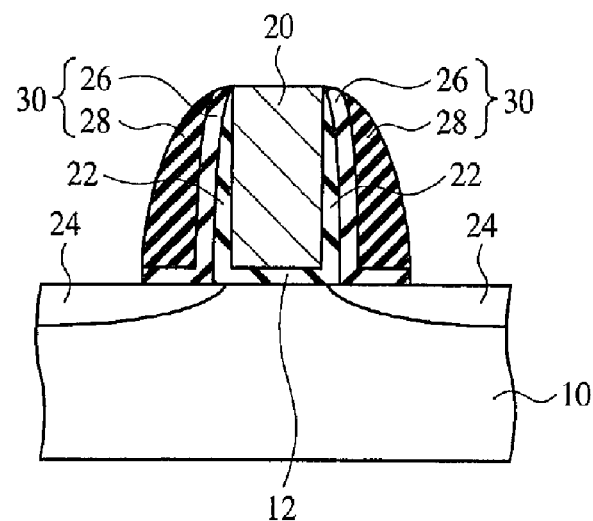

Next, a silicon oxide film 26 of, e.g., a 10 nm-thickness and a silicon nitride film 28 of, e.g., a 30 nm-thickness are deposited by CVD method and etched back to form the sidewall insulating films 30 from the silicon oxide film 26 and the silicon nitride film 28 on the sidewalls 22 of the gate electrode 20 (FIG. 4A).

Figure 4B:
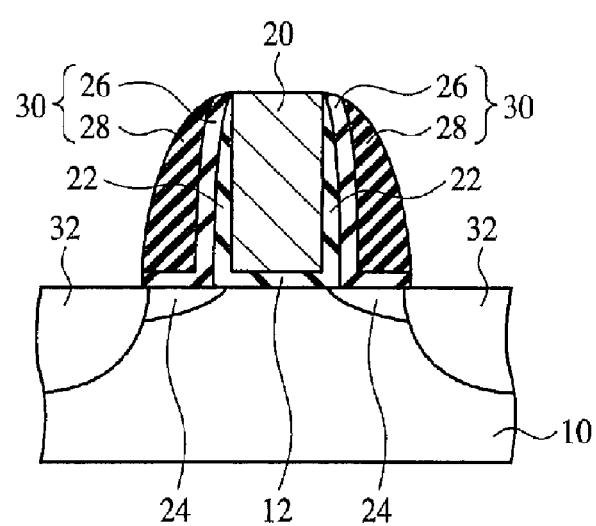

Next, with the gate electrode 20 and the sidewall insulating films 22, 30 as the mask, ion implantation is performed to form impurity regions 32 in the silicon substrate 10 on both sides of the gate electrode 20 (FIG. 4B).

Figure 4C:
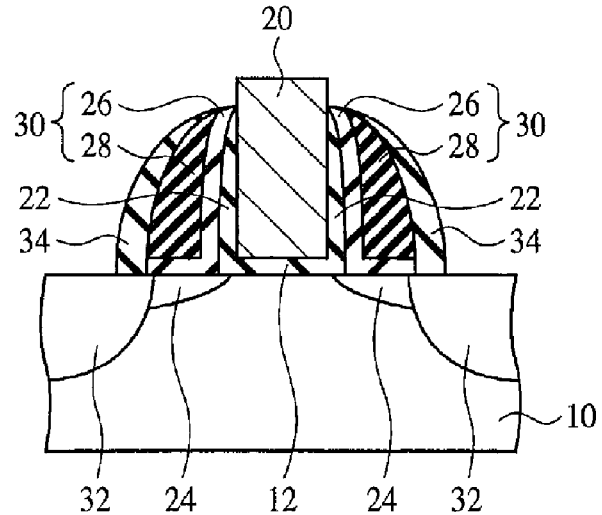

Next, a silicon oxide film of, e.g., a 50 nm-thickness is deposited by CVD method and etched back to form the sidewall insulating films 34 of the silicon oxide film on the side walls of the gate electrode 20 (FIG. 4C).

Next, with the gate electrode 20 and the sidewall insulating films 22, 30, 34 as the mask, impurity ions are implanted to form impurity regions 36 in the silicon substrate on both sides of the gate electrode 20.

Thus, the source/drain regions 38 of the impurity regions 24, 32, 36 of the gate electrodes 20 are formed.

Next, a 20 nm-thick nickel film, for example, is deposited on the entire surface by, e.g., sputtering method.

Next, thermal processing is conducted in, e.g., a nitrogen atmosphere, and e.g., at 300° C. for 3 minutes. This thermal treatment causes the silicidation reaction on the gate electrode 20 and the source/drain regions 38 where silicon is exposed, and the nickel silicide films of, e.g., a 10 nm-thickness is formed on the gate electrode 20 and the source/drain regions 38.

Figure 5A:
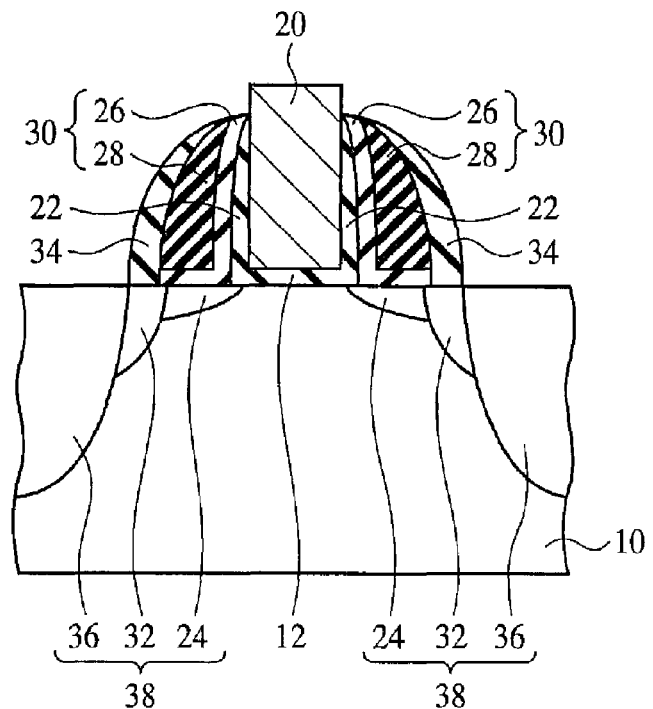
Figure 5B:
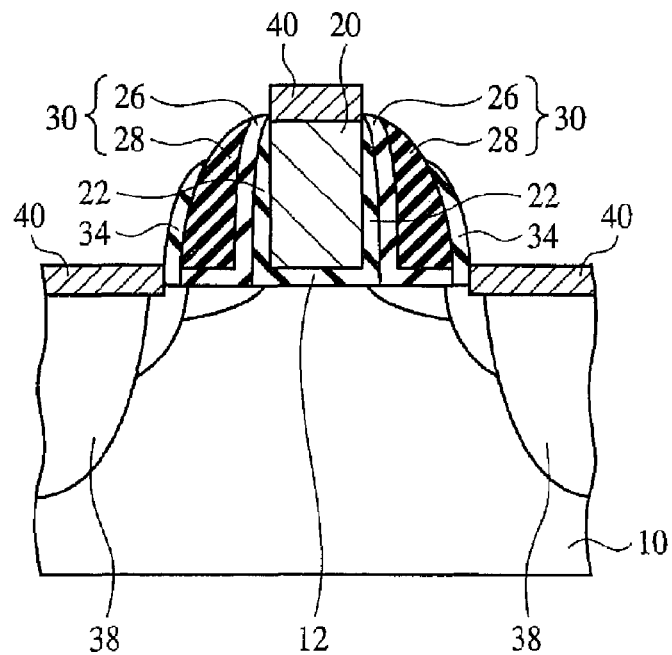

Next, unreacted nickel film is removed by wet etching using, e.g., SPM (Sulfuric acid/Hydrogen peroxide aqueous solution) (FIG. 5B).

The nickel silicide film 40 may be formed only on the source/drain regions 38 by first forming a mask film, such as silicon nitride film or others on the gate electrode 20.

In place of the nickel silicide film, another metal silicide film, such as titanium silicide, chrome silicide, cobalt silicide or others, may be used.

Figure 6A:
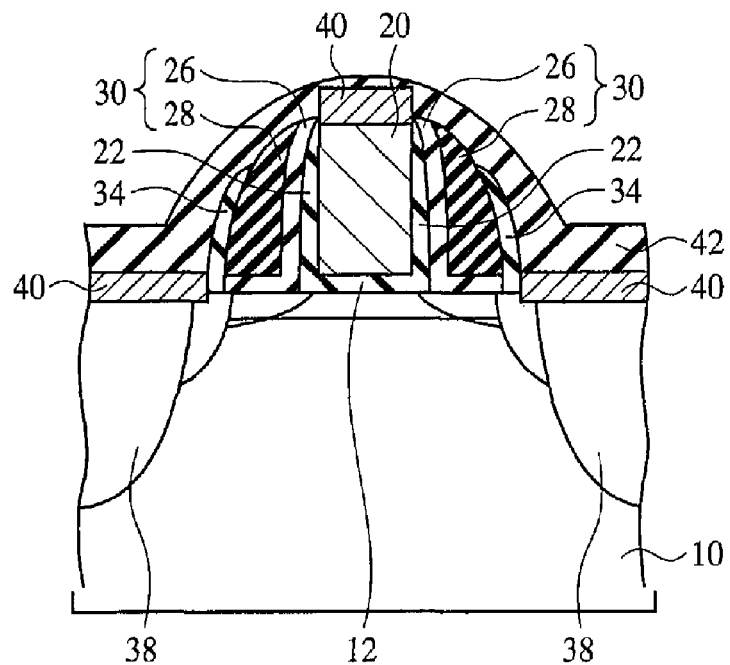

Then, a silicon oxide film 42 of, e.g., a 50 nm-thickness is deposited on the entire surface by, e.g., high density plasma CVD method (FIG. 6A). In forming the silicon oxide film 42, conditions for the film formation are set so that the silicon oxide film 42 has a sufficiently smaller film thickness on the gate electrode than on the remaining surfaces (e.g., on the source/drain regions 38). The silicon oxide film 42 is formed, for example, at a 120 sccm $SiH_4$ flow rate, a 220 sccm $O_2$ flow rate, a 500 sccm-He flow rate, and at a power of LF (low frequency power)/HF (high frequency power) 3200 W/500 W, whereby the silicon oxide film 42 can have a smaller thickness on the gate electrode 20 than on the remaining surfaces.

In place of the silicon oxide film 42 deposited by high density plasma CVD method, a SOG film may be deposited by spin coating method. By spin coating method, in which an applied film flows in the direction where the film surface is flattened, the film thickness on the projected parts naturally becomes smaller than the film thickness on the flat part.

Figure 6B:
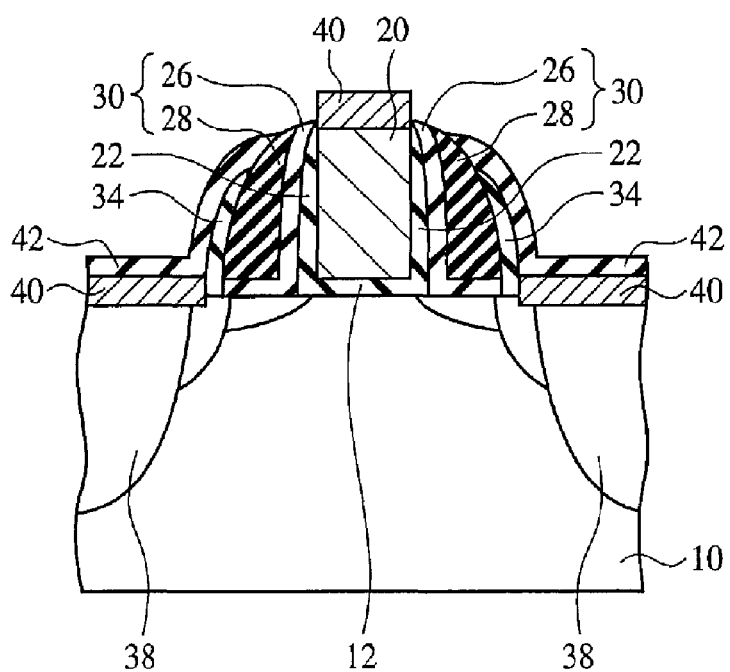

Then, the silicon oxide film 42 is anisotropically etched by, e.g., dry etching until the nickel silicide film 40 on the gate electrode 40 is exposed. At this time, the silicon oxide film 42 formed on the source/drain regions 38, which is sufficiently thicker than the silicon oxide film formed on the gate electrode 20, covers the nickel silicide film 40 on the source/drain regions even after the nickel silicide film on the gate electrode 20 has been exposed (FIG. 6B).

The nickel silicide film 40 on the gate electrode 20 maybe removed when the silicon oxide film 42 is etched.

For the etching of the silicon oxide film 42, wet etching with a hydrofluoric acid-based aqueous solution may be used.

In this case, the nickel silicide film 40 on the gate electrode 20 can be etched together with the silicon oxide film 42.

Next, a 30 nm-thick nickel film is deposited on the entire surface by, e.g., sputtering method.

Next, thermal processing is conducted in, e.g., a nitrogen atmosphere and, e.g., at 400° C. for 1 minute. This thermal processing advances the silicidation reaction between the gate electrode 20 and the nickel film from the upper surface of the gate electrode 20 and substitutes the entire gate electrode 20 up to the gate insulating film 12 into the nickel silicide. Thus, a gate electrode 44 of nickel silicide is formed.

At this time, because of the silicon oxide film 42 remaining on the source/drain regions 38, the silicidation reaction does not advance in the source/drain regions 38. Accordingly, the inconvenience of the nickel silicide film 40 on the source/drain regions 38 thickening, and thus causing junction breakage of the source/drain regions 38, etc. does not take place.

The silicidation reaction for substituting the gate electrode 20 into the nickel silicide advances from the upper surface of the gate electrode 20. When concavities and convexities are present in the surface of the polycrystalline silicon film 14, the silicidation reaction arrives at the gate insulating film 12 earlier in the cavities, and the silicidation reaction on the gate insulating film 12 becomes inhomogeneous. Resultantly, there is a risk that the gate insulating film 12 may be damaged (see FIG. 8A).

In contrast to this, in the method for fabricating the semiconductor device according to the present embodiment, the surface of the polycrystalline silicon film 14 is planarized in the step shown in FIG. 2B. Accordingly, the silicidation of the gate electrode 20 advances homogeneously from the upper surface of the gate electrode 20 (see FIG. 8B), and the gate insulating film 12 can be prevented from being damaged.

Figure 7A:
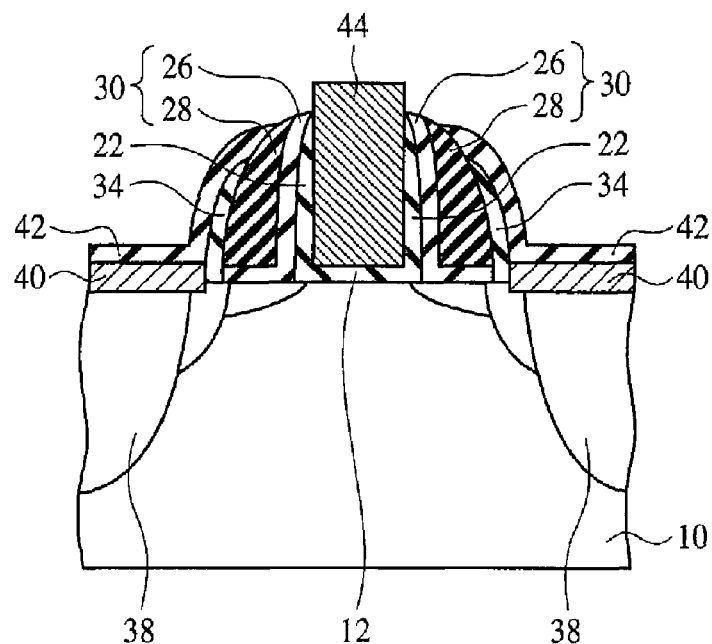
Figure 8A:
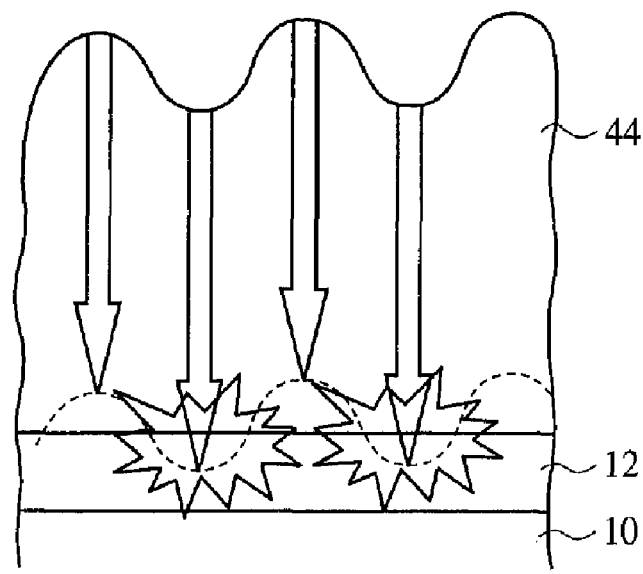
FIGS. 8A and 8B are views explaining the effect produced by planarizing the surface of the polycrystalline silicon film to be the gate electrode.
Figure 8B:
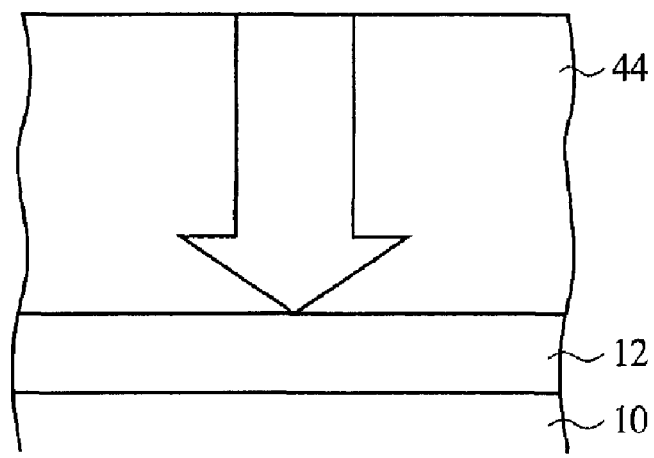

Next, unreacted nickel film is removed by wet etching using, e.g., SPM (Sulfuric acid/Hydrogen peroxide aqueous solution) (FIG. 7A).

Figure 7B:
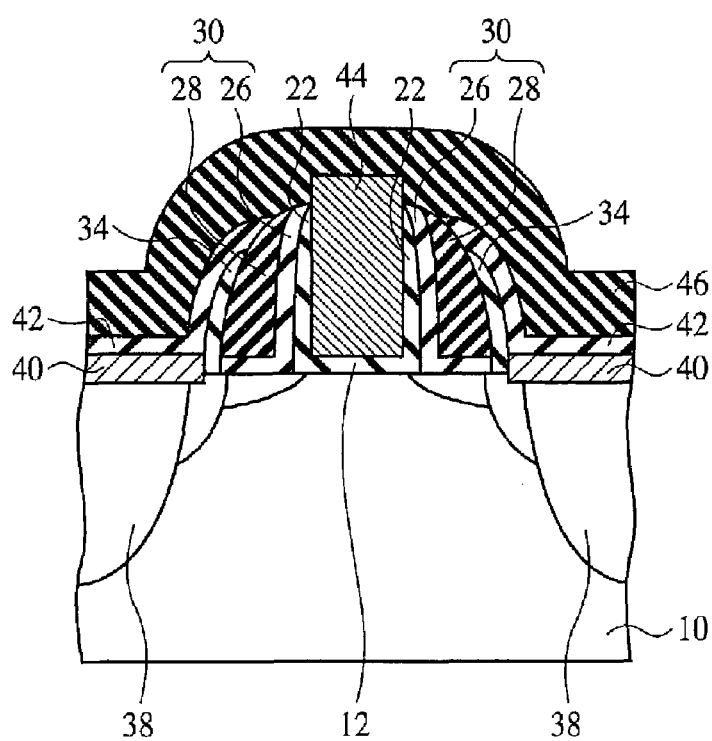

Then, a 100 nm-thick silicon nitride film, for example, is deposited on the entire surface to form the stressor film 46 (FIG. 7B). The stressor film 46 is formed, extended from the side walls of the gate electrode 44 onto the upper surface to cover the gate electrode 44, and can apply a required stress to the channel region.

The silicon nitride film as the stressor film 46 is deposited to have a 1.5 GPa tensile stress so as to apply the tensile stress to the channel region, for example, by LPCVD method at a 500° C. film forming temperature, a 60 sccm $Si_2H_6$ flow rate and a 5 slm $NH_3$ flow rate and under a 300 Torr pressure.

For the n-channel MISFET, a stressor film 46 having a tensile stress from about 1.0 to 2.0 GPa with respect to the silicon substrate 10 is effective to improve the mobility of the electrons in the channel, and for the p-channel MISFET, a stressor film 46 having a compression stress from about 1.0 to 3.0 GPa with respect to the silicon substrate is effective to improve the mobility of the holes in the channel. It is preferable to set conditions for forming the stressor film 46 suitably corresponding to sizes, kinds, required characteristics, etc. of the MISFET to be formed.

As described above, according to the present embodiment, the pattern dependency of the deposited film thickness for the insulating film 42 is utilized to cover the MISFET thinner on the gate electrode and thicker on the remaining surfaces, whereby the upper part of the gate electrode can be selectively exposed without using a CMP process. This facilitates substituting the gate electrode into metal silicide. The stressor film formed after the gate electrode has been substituted into metal silicide is formed from the side walls of the gate electrode onto the upper surface thereof, whereby the stressor film can apply a required stress to the channel region.

Thus, the above described the present embodiment of a semiconductor device and method for fabricating the same, suppresses the depletion of the gate electrode, and gate resistance can therefore be decreased in comparison to the gate electrode of the polycide structure. A required stress can be applied to the channel region by the stressor film, whereby the mobility of carriers in the channel can be improved. Thus, the MISFET can be operated at high speed.

The surface of polycrystalline silicon film to be the gate electrode is planarized initially after it is deposited, whereby the gate insulating film is not damaged in the process of the silicidation reaction for substituting the gate electrode into the metal silicide.

The semiconductor device and the method for fabricating the same according to a second embodiment of the present invention will be explained with reference to FIGS. 9 to 11C. The same members of the present embodiment as those of the semiconductor device and the method for fabricating the same according to first embodiment shown in FIGS. 1 to 8B are represented by the same reference numbers. Additionally, method steps of fabrication which are the same for both embodiments are not repeated to simplify their explanation.

Figure 9:
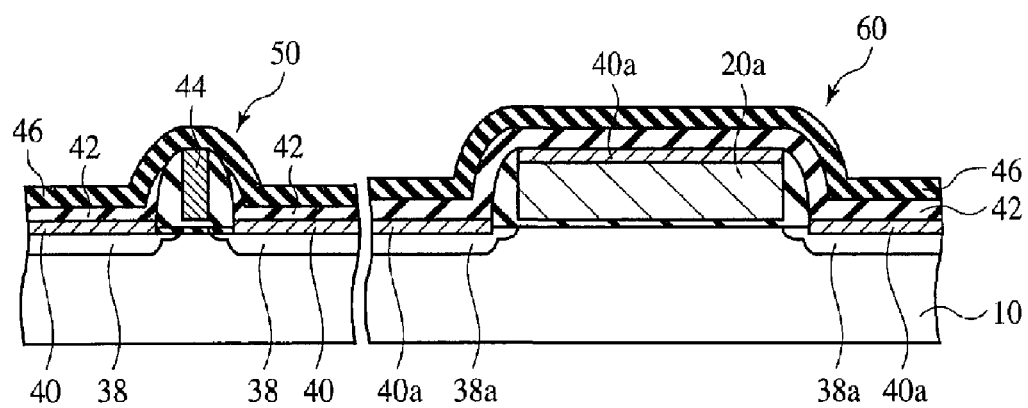
FIG. 9 is a diagrammatic sectional view of the semiconductor device according to a second embodiment of the present invention.

FIG. 9 is a diagrammatic sectional view of the semiconductor device according to the present embodiment, which shows a structure thereof. FIGS. 10A-10C and 11A-11C are sectional views of the semiconductor device according to the present embodiment in the steps of the method for fabricating the same, which show the method.

In the first embodiment described above, a MISFET including the gate electrode of metal silicide and the method for fabricating the same are described. However, it is sufficient for some semiconductor devices that only the gate electrodes of MISFETs of the logic circuit, etc., which require high speed operation, have silicide gates, and the other MISFETs have polycide gates or polycrystalline silicon gates. In the present embodiment, a semiconductor device comprising MISFETs including different gate electrode structures will be described.

First, the structure of the semiconductor device according to the present embodiment will be explained with reference to FIG. 9.

A MISFET 50 whose gate length is short and a MISFET whose gate length is long are formed on a silicon substrate 10.

The MISFET 50 includes a gate electrode 44 of metal silicide formed over the silicon substrate with a gate insulating film interposed therebetween, and source/drain regions 38 formed in the silicon substrate 10 on both sides of the gate electrode 44. A nickel silicide film 40 is formed on the source/drain regions 38.

The MISFET 60 includes a gate electrode 20a of polycrystalline silicon formed over the silicon substrate 10 with the gate insulating film interposed therebetween, and source/drain regions 38a formed in the silicon substrate 10 on both sides of the gate electrode 20a. A nickel silicide film 40a is formed on the gate electrode 20a and the source/drain regions 38a.

A silicon oxide film 42 is formed on the nickel silicide film 40 formed on the source/drain regions 38 of the MISFET 50. The silicon oxide film 42 is not extended over the gate electrode 44 of the MISFET 50.

The silicon oxide film 42 is formed on the MISFET 60, covering the MISFET 60. That is, the silicon oxide film 42 is extended on the nickel silicide film 40a formed on the source/drain regions 38a and also on the nickel silicide film 40a formed on the gate electrode 20a.

A stressor film 46 is formed over the MISFETs 50, 60 with the silicon oxide film 42 formed on.

As described above, the semiconductor device according to the present embodiment includes the MISFET 50 whose gate length is short and the MISFET 60 whose gate length is long, the gate electrode 44 of the MISFET 50 is formed of metal silicide, and the gate electrode 20a of the MISFET 60 is a polycide. The stressor film 46 is formed from the side walls of the gate electrode 44 of the MISFET 50 onto the upper surface thereof.

A semiconductor device is thus constituted, whereby the gate resistance of the MISFET 50 with a short gate length (which is required to have high speed operation) can be decreased, and thus the mobility of carriers in the channel can be improved. Hence, the MISFET will operate at high speed. The MISFET 60 with long gate length (the entire gate electrode of which is not required to be silicided) can have the polycide gate structure.

Next, the method for fabricating the semiconductor device according to the present embodiment will be explained with reference to FIGS. 10A and 11C.

Figure 10A:
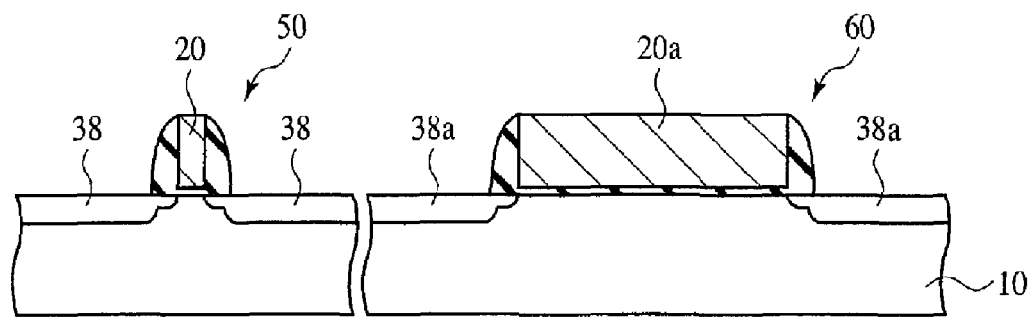
FIGS. 10A-10C and 11A-11C are sectional views of the semiconductor device according to the second embodiment of the present invention in the steps of the method for fabricating the same.

First, in the same way as in, e.g. the method for fabricating the semiconductor device according to the first embodiment shown in FIGS. 2A to 5A, over the silicon substrate 10, the MISFET 50 with short gate length including the gate electrode of polycrystalline silicon film and the source/drain regions 38 formed in the silicon substrate 10 on both sides of the gate electrode 20, and the MISFET 60 with long gate length including the gate electrode 20a of polycrystalline silicon film and the source/drain regions 38a formed in the silicon substrate 10 on both sides of the gate electrode 20a are formed (FIG. 10A).

Next, a 20 nm-thick nickel film, for example is deposited on the entire surface by, e.g., sputtering method.

Next, thermal processing is conducted in, e.g., a nitrogen atmosphere and, e.g., at 300° C. for 3 minutes. This thermal processing causes the silicidation reaction on the gate electrodes 20, 20a and the source/drain regions 38, 38a with silicon exposed, and the nickel silicide film 40, 40a of a 20 nm-thick is formed on the gate electrode 20, 20a and the source/drain regions 38, 38a.

Figure 10B:
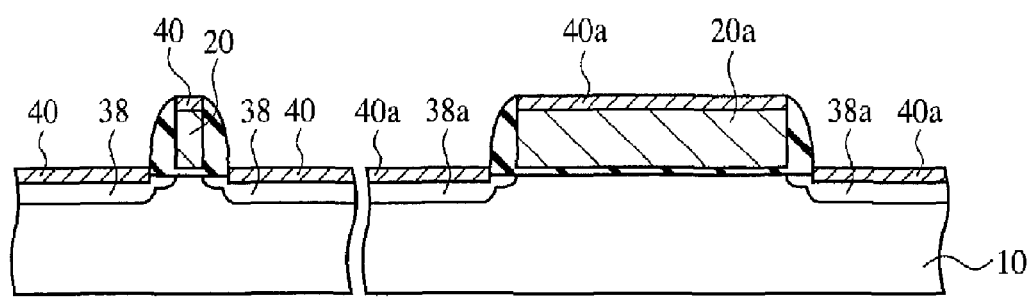

Next, the unreacted nickel film is removed by wet etching using, e.g., SPM (Sulfuric acid/Hydrogen peroxide aqueous solution) (FIG. 10B).

The nickel silicide film 40, 40a may be formed only on the source/drain regions 38a, 38a by forming a mask film of silicon nitride film or others on the gate electrode 20 and the gate electrode 20a.

In place of the nickel silicide film, another metal silicide film, such as titanium silicide, chrome silicide, cobalt silicide or others, may be formed.

Figure 10C:
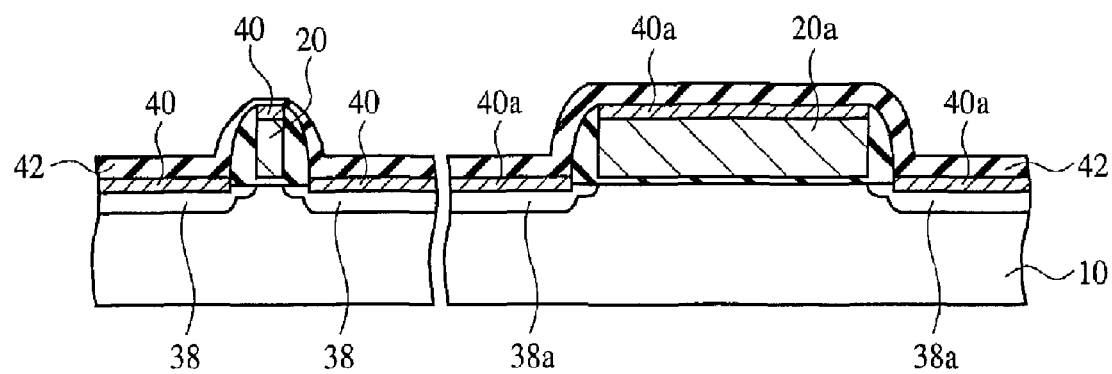

Then, the silicon oxide film 42 of, e.g., a 50 nm-thickness is deposited on the entire surface by, e.g., high density plasma CVD method (FIG. 10C). For the step of forming the silicon oxide film 42, conditions for the film formation are set so that the film thickness of the silicon oxide film 42 is sufficiently smaller on the gate electrode 20 than on the remaining surfaces (e.g., on the source/drain regions 38, 38a). The silicon oxide film 42 is formed under conditions of, e.g., a 120 sccm SiH$_4$ flow rate, a 220 sccm O$_2$ flow rate, a 500 sccm He flow rate and a power of LF (low frequency power)/HF (high frequency power)=3200 W/500 W, whereby the silicon oxide film 42 becomes thinner on the gate electrode 20 than on the remaining surfaces.

At this time, the film thickness of the silicon oxide film changes depending on the size of the base convexity (gate length). For example, when the gate length is not more than 0.1 µm, the film thickness on the electrode becomes smaller than that on the remaining surfaces, but when the gate length is not less than about 0.2 µm, the film thickness on the electrode becomes substantially equal to that on the remaining surfaces. Accordingly, the gate length of the gate electrode 20 is, e.g., 0.05 µm, and the gate length of the gate electrode 20*a* is 0.2 µm, whereby the film thickness of the silicon oxide film 42 on the gate electrode 20 becomes sufficiently smaller than the film thickness on the remaining surfaces (e.g., on the source/drain regions 38, 38*a*), and the film thickness of the silicon oxide film 42 on the gate electrode 20*a* becomes substantially equal to that on the remaining surfaces.

In place of depositing the silicon oxide film 42 by high density plasma CVD method, SOG film may be deposited by spin coating method. By spin coating method, in which an applied film flows in the direction where the film surface is flattened, the film thickness on the projected parts naturally becomes smaller than the film thickness on the flat surfaces.

Then, a photoresist film 48 which covers the region the MISFET 60 is to be formed in, and exposes the region for the MISFET 50 is to be formed in, is formed by photolithography.

Figure 11A:
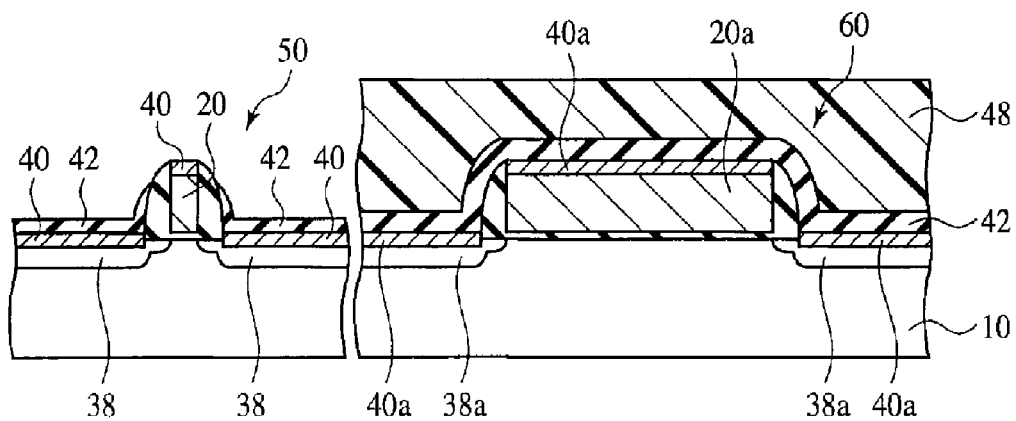

Next, dry etching is conducted with the photoresist film 48 as the mask to anisotropically etch the silicon oxide film 42 until the nickel silicide film 40 on the gate electrode 20 is exposed. At this time, the silicon oxide film 42, which is thicker on the source/drain regions 38 than on the gate electrode 20, still covers the nickel silicide film 40 on the source/drain regions even after the nickel silicide film 40 on the gate electrode 20 has been exposed (FIG. 11A).

The nickel silicide film 40 on the gate electrode 20*a* may be removed when the silicon oxide film 42 is etched.

The silicon oxide film 42 may be etched by wet etching using a hydrofluoric acid-based aqueous solution. In this case, the nickel silicide film 40 can be removed together with the silicon oxide film 42.

Next, the photoresist film 48 is removed by, e.g., ashing.

The photoresist film 48 is not essentially formed when the silicon oxide film 42 on the gate electrode 20 is thin enough for the upper surface of the gate electrode 20 to be selectively exposed without forming the photoresist film 48.

Next, a 30 nm-thick nickel film, for example, is deposited on the entire surface by, e.g., sputtering method.

Then, thermal processing is conducted in, e.g., a nitrogen atmosphere and, e.g., at 400° C. for 1 minute. This thermal processing advances the silicidation reaction between the gate electrode 20 and the nickel film and substitutes the entire gate electrode 20 up to the gate insulating film 12 into nickel silicide. Thus, a gate electrode 44 of nickel silicide is formed.

At this time, because of the silicon oxide film 42 remaining on the gate electrode 20*a* and on the source/drain regions 38, 38*a*, the silicidation reaction does not advance on the gate electrode 20*a* and the source/drain regions 38, 38*a*.

Figure 11B:
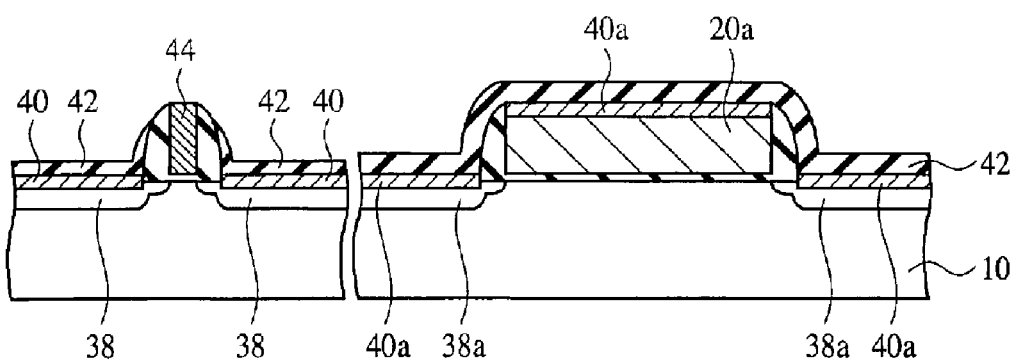
Figure 11C:
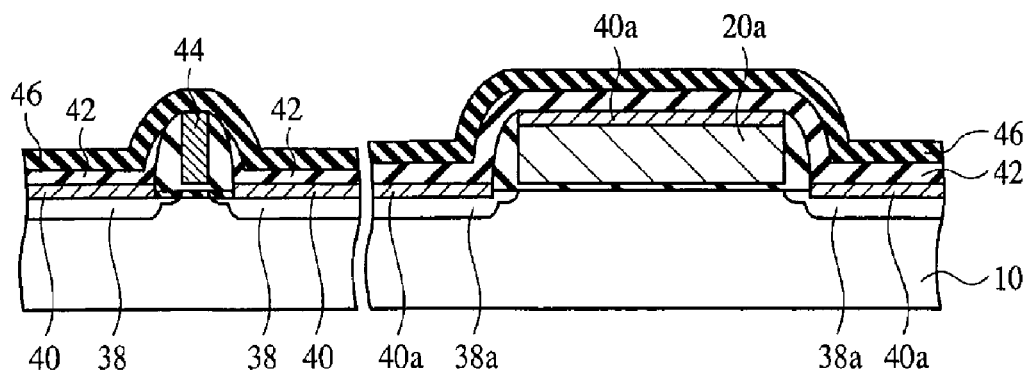

Next, the unreacted nickel film is removed by wet etching using, e.g., SPM (Sulfuric acid/Hydrogen peroxide aqueous solution) (FIG. 11B).

Then a 100 nm-thick silicon nitride film, for example, is deposited on the entire surface to form a stressor film 46 of silicon nitride. The stressor film 46 is formed over the gate electrode 44 from the side walls thereof onto the upper surface thereof, and can apply a required stress to the channel region of the MISFET 50.

As described above, according to the present embodiment, the pattern dependency of the deposited film thickness for the insulating film is utilized to cover the MISFETs thinner on the gate electrode of the MISFET with short gate length and thicker on the gate electrode of the MISFET with long gate length. Therefore, the upper part of the gate electrode of the MISFET with short gate length can be selectively exposed without using a CMP process.

Accordingly, the gate electrode of a MISFET with short gate length, which is required to have high operation speed, can be formed of metal silicide without complicating the fabrication steps, and a MISFET with long gate length, which does not require metal silicide gate, may have the polycide gate.

The present invention is not limited to the above-described embodiments and can cover other various modifications.

For example, in the first and the second embodiments described above, the metal silicide film 40, 40*a* on the gate electrodes 20, 20*a* and the source/drain regions 38, 38*a* is formed by salicide (self-aligned silicide) process. However, the metal silicide film 40, 40*a* may not be formed.

Figure 12:
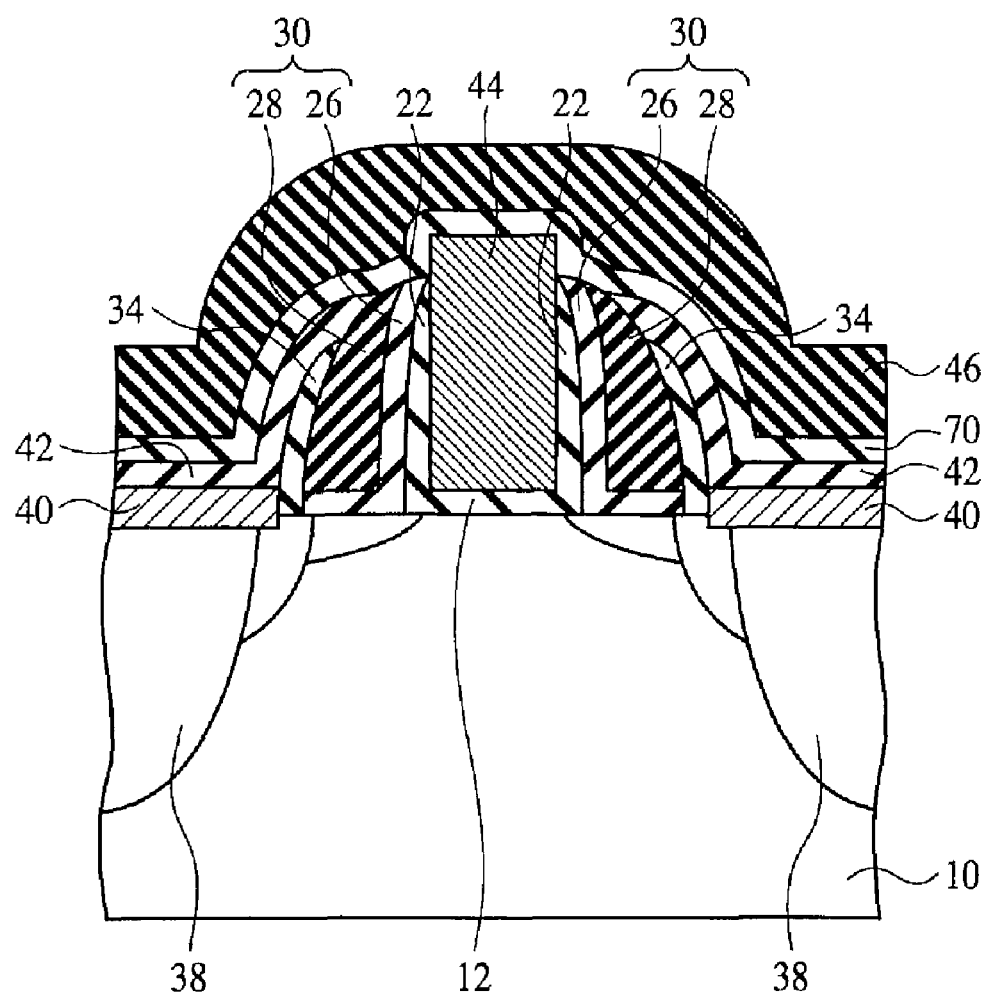
FIG. 12 is a diagrammatic sectional view of the semiconductor device according to a modified embodiment of the present invention.

In the above-described embodiments, the stressor film 46 of the silicon nitride film is formed on the silicon oxide film 26. However, one or more insulating films may be formed between the silicon oxide film 26 and the stressor film 46. For example, as shown in FIG. 12, the silicon oxide film 70 may be formed between the silicon oxide film 26 and the stressor film 46. The silicon oxide film 70 may be formed over the upper surface of the gate electrode 20. The silicon oxide film 70 is for, e.g., an etching stopper film for preventing the gate electrode 20 of the metal silicide film from being damaged when the stressor film 46 is etched to form the contact hole (not shown) reaching the gate electrode 20.

In the above-described embodiments, the sidewall insulating films 22, 30, 34 are formed in 3 stages, and the source/drain regions are formed of the impurity layers 24, 32, 36. However, the structures of the sidewall insulating film and the source/drain regions are not limited thereto.

The source/drain regions may be formed of one impurity region or may have an LDD structure or extension structure. Pocket regions may be provided between the channel region and the source/drain regions. Preferably, the structure of the sidewall insulating film is set suitably in accordance with a structure of the source/drain regions and other requirements.

What is claimed is:

1. A method for fabricating a semiconductor device comprising:
    forming an n-channel MISFET including source/drain regions formed in a semiconductor substrate and a first gate electrode of a polycrystalline silicon formed over the silicon substrate;
    forming a first insulating film over the semiconductor substrate and the n-channel MISFET, wherein thickness of the first insulating film on the first gate electrode is thinner than thickness of the first insulating film on the source/drain regions;
    etching the first insulating film to expose the gate electrode, while the first insulating film remains on the source/drain regions;
    substituting the polycrystalline silicon forming the first gate electrode into a metal silicide; and
    forming a second insulating film over the first gate electrode from side walls of the first gate electrode to an upper surface of the first gate electrode and having a tensile stress from 1.0 to 2.0 GPa.

2. The method for fabricating a semiconductor device according to claim 1, wherein forming the MISFET comprises:
    forming the gate insulating film and a polycrystalline silicon film over the semiconductor substrate;
    polishing a surface of the polycrystalline silicon film flat; and patterning the polycrystalline silicon film to form the first gate electrode.

3. The method for fabricating a semiconductor device according to claim 1, further comprising, after forming the MISFET and before forming the first insulating film:
   forming a metal silicide film on the surface of the source/drain regions of the semiconductor substrate.

4. The method for fabricating a semiconductor device according to claim 3, wherein
   the metal silicide film is formed also on the first gate electrode.

5. The method for fabricating a semiconductor device according to claim 1, wherein
   in forming the MISFET, another MISFET including a second gate electrode having a gate length longer than a gate length of the first gate electrode is formed over the semiconductor substrate,
   the first insulating film is formed thin on the first gate electrode and thick on the source/drain regions and the second gate electrode, and
   the first insulating film is etched, so as to leave the first insulating film on the source/drain regions and the second gate electrode and remove the first insulating film from the first gate electrode.

6. The method for fabricating a semiconductor device according to claim 1, wherein
   the first insulating film comprises silicon oxide formed by high density plasma CVD or spin coating.

7. The method for fabricating a semiconductor device according to claim 1, wherein
   in the step of etching the first insulating film, the first insulating film is etched without using a mask.

8. The method for fabricating a semiconductor device according to claim 1, wherein
   in substituting the polycrystalline silicon into the metal silicide, the polycrystalline silicon is fully silicided to form the first gate electrode of the metal silicide.

9. A method for fabricating a semiconductor device comprising:
   forming a p-channel MISFET including source/drain regions formed in a semiconductor substrate and a first gate electrode of a polycrystalline silicon formed over the silicon substrate;
   forming a first insulating film over the semiconductor substrate and the p-channel MISFET, wherein thickness of the first insulating film on the first gate electrode is thinner than thickness of the first insulating film on the source/drain regions;
   etching the first insulating film to expose the gate electrode, while the first insulating film remains on the source/drain regions;
   substituting the polycrystalline silicon forming the first gate electrode into a metal silicide; and
   forming a second insulating film over the first gate electrode from side walls of the first gate electrode to an upper surface of the first gate electrode and having a compression stress from 1.0 to 3.0 GPa.

10. The method for fabricating a semiconductor device according to claim 9, wherein forming the MISFET comprises:
    forming the gate insulating film and a polycrystalline silicon film over the semiconductor substrate;
    polishing a surface of the polycrystalline silicon film flat; and
    patterning the polycrystalline silicon film to form the first gate electrode.

11. The method for fabricating a semiconductor device according to claim 9, further comprising, after forming the MISFET and before forming the first insulating film:
    forming a metal silicide film on the surface of the source/drain regions of the semiconductor substrate.

12. The method for fabricating a semiconductor device according to claim 11, wherein
    the metal silicide film is formed also on the first gate electrode.

13. The method for fabricating a semiconductor device according to claim 9, wherein
    in forming the MISFET, a second MISFET including a second gate electrode with a gate length longer than a gate length of the first gate electrode is formed over the semiconductor substrate,
    in forming the first insulating film, the first insulating film is formed thin on the first gate electrode and thick on the source/drain regions and the second gate electrode, and
    in etching the first insulating film, the first insulating film is etched so as to leave the first insulating film on the source/drain regions and the second gate electrode, and remove the first insulating film from the first gate electrode.

14. The method for fabricating a semiconductor device according to claim 9, wherein
    the first insulating film comprises silicon oxide formed by high density plasma CVD or spin coating.

15. The method for fabricating a semiconductor device according to claim 9, wherein
    the first insulating film is etched without using a mask.

16. The method for fabricating a semiconductor device according to claim 9, wherein
    in substituting the polycrystalline silicon into the metal silicide, the polycrystalline silicon is fully silicided to form the first gate electrode of the metal silicide.

* * * * *